US009287155B2

(12) United States Patent
Kim et al.

(10) Patent No.: US 9,287,155 B2
(45) Date of Patent: Mar. 15, 2016

(54) APPARATUS AND METHOD OF CONTROLLING CHUCK, AND EXPOSURE APPARATUS AND CONTROL METHOD THEREOF

(75) Inventors: Ja Yul Kim, Seoul (KR); Sang Don Jang, Suwon-si (KR); Tae Kyu Son, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 770 days.

(21) Appl. No.: 13/535,603

(22) Filed: Jun. 28, 2012

(65) Prior Publication Data
US 2013/0001898 A1    Jan. 3, 2013

(30) Foreign Application Priority Data

Jun. 28, 2011  (KR) .................. 10-2011-0062879

(51) Int. Cl.
*H01L 21/68*  (2006.01)
*G03F 7/20*   (2006.01)

(52) U.S. Cl.
CPC .............. *H01L 21/681* (2013.01); *G03F 7/707* (2013.01); *G03F 7/70775* (2013.01); *Y10T 29/49998* (2015.01); *Y10T 29/53013* (2015.01); *Y10T 29/53022* (2015.01); *Y10T 29/53052* (2015.01); *Y10T 29/53061* (2015.01); *Y10T 29/53087* (2015.01); *Y10T 29/53091* (2015.01); *Y10T 279/21* (2015.01)

(58) Field of Classification Search
CPC ... G03F 7/70775; G03F 7/707; H01L 21/681; Y10T 279/21; Y10T 29/49998; Y10T 29/53022; Y10T 29/53013; Y10T 29/53052; Y10T 29/53061; Y10T 29/53087; Y10T 29/53091

USPC .......... 29/559, 703, 705, 707, 709, 712, 714, 29/720, 721; 702/151; 279/126
See application file for complete search history.

(56) References Cited

U.S. PATENT DOCUMENTS

| | | | | |
|---|---|---|---|---|
| 6,099,217 A   * |  8/2000 | Wiegand et al. | ............. | 409/201 |
| 6,333,786 B1 * | 12/2001 | Uzawa et al. | ................ | 356/401 |
| 6,567,713 B2 * |  5/2003 | Lichtenstein et al. | .......... | 700/58 |
| 6,574,524 B2 * |  6/2003 | Kim | ............................. | 700/121 |
| 6,606,154 B1 * |  8/2003 | Oda | ............................. | 356/244 |
| 6,732,004 B2 * |  5/2004 | Mos et al. | .................... | 700/114 |
| 6,744,512 B2 * |  6/2004 | Takahashi | ..................... | 356/401 |
| 6,803,592 B2 * | 10/2004 | Yoshida | ........................ | 250/548 |
| 6,856,931 B2 * |  2/2005 | Yoshida | ........................ | 702/127 |
| 6,879,868 B2 * |  4/2005 | Mos et al. | .................... | 700/114 |
| 6,885,908 B2 * |  4/2005 | Yoshida et al. | ............... | 700/191 |
| 6,922,063 B2 * |  7/2005 | Heger | ........................... | 324/658 |
| 6,925,203 B1 * |  8/2005 | Tanaka | .......................... | 382/151 |
| 6,988,319 B2 * |  1/2006 | Hung | ............................. | 33/291 |
| 7,277,818 B2 * | 10/2007 | Sakata | ............... | G01M 11/025 702/154 |
| 7,312,873 B2 * | 12/2007 | Haginiwa | ..................... | 356/401 |
| 7,408,624 B2 * |  8/2008 | Van De Moosdijk et al. | .. | 355/72 |

(Continued)

*Primary Examiner* — David Bryant
*Assistant Examiner* — Bayan Salone
(74) *Attorney, Agent, or Firm* — H.C. Park & Associates, PLC

(57) ABSTRACT

Exemplary embodiments of the invention disclose an exposure apparatus and a method of tuning parameters of a chuck, which may reduce a time taken to level the chuck by previously tuning parameters of the chuck. The method of tuning parameters of a chuck includes detecting a tilt component of the chuck, performing chuck tilt adjustment to minimize the tilt component of the chuck, and tuning the parameters of the chuck if a residual tilt component is present after performing the chuck tilt adjustment.

16 Claims, 10 Drawing Sheets

(56) References Cited

U.S. PATENT DOCUMENTS

| | | | |
|---|---|---|---|
| 7,418,125 B2 * | 8/2008 | Miyashita | 382/151 |
| 7,493,702 B2 * | 2/2009 | Waibel et al. | 33/366.11 |
| 7,590,280 B2 * | 9/2009 | Tanaka | 382/151 |
| 7,660,696 B1 * | 2/2010 | Norton | G01N 21/9501 356/601 |
| 7,672,000 B2 * | 3/2010 | Hayashi | 356/614 |
| 7,896,607 B2 * | 3/2011 | Jonas | 414/816 |
| 7,944,369 B2 * | 5/2011 | Appleyard et al. | 340/689 |
| 8,393,849 B2 * | 3/2013 | Jonas | F16M 11/04 414/774 |
| 2003/0206794 A1 * | 11/2003 | Konig | H01L 21/68 414/757 |
| 2006/0073005 A1 * | 4/2006 | Jonas | F16M 11/10 414/784 |
| 2007/0002303 A1 * | 1/2007 | Van De Moosdijk et al. | 355/72 |
| 2008/0079920 A1 * | 4/2008 | Hommen | G03F 7/7085 355/55 |
| 2008/0106722 A1 * | 5/2008 | Shibazaki | 355/75 |
| 2008/0243426 A1 * | 10/2008 | Lundgren | 702/151 |
| 2009/0021236 A1 * | 1/2009 | Foster et al. | 324/76.11 |
| 2009/0051894 A1 * | 2/2009 | Shibazaki | G03F 7/70725 355/72 |
| 2009/0299689 A1 * | 12/2009 | Stubben | G01C 9/08 702/154 |
| 2009/0309532 A1 * | 12/2009 | Ueda | 318/600 |
| 2009/0312982 A1 * | 12/2009 | Foster et al. | 702/151 |
| 2009/0326859 A1 * | 12/2009 | Hammerschmidt et al. | 702/151 |
| 2012/0324711 A1 * | 12/2012 | Wang | 29/559 |

* cited by examiner

APPARATUS AND METHOD OF CONTROLLING CHUCK, AND EXPOSURE APPARATUS AND CONTROL METHOD THEREOF

CROSS REFERENCE TO RELATED APPLICATION

This application claims priority from and the benefit of Korean Patent Application No. 10-2011-0062879, filed on Jun. 28, 2011, which is hereby incorporated by reference for all purposes as if fully set forth herein.

BACKGROUND OF THE INVENTION

1. Field of the Invention

Exemplary embodiments of the present invention relate to a multi-point support chuck for use in an exposure apparatus or an optical inspection apparatus.

2. Description of the Background

To adjust a chuck on a stage to a height of focus of an optical projection system, a test exposure may be performed in which a plate placed on the chuck is exposed while varying the height of the chuck. Based on the test results, a height of the chuck representing the highest resolution may be determined, and the determined height may be set to a reference height of the chuck.

Upon adjusting a position of the chuck to the reference height and exposing the plate on the chuck, auto focusing is performed while the stage is located at a certain position within an exposure region. If the reference height of the chuck differs from a height required for accurate focusing, the position of the chuck may be adjusted above or below the reference height, so as to accurately locate the plate on the chuck at the focus point of the optical projection system.

In the case of an exposure apparatus or an optical inspection apparatus, Depth of Focus (DOF) is an important tuning parameter. DOF of the exposure apparatus refers to a depth of focus in a longitudinal direction of an optical system to enable a pattern to be normally exposed onto a plate. DOF of the optical inspection apparatus refers to a depth of focus of an image capture device (e.g., a camera). A plate in the exposure apparatus or the optical inspection apparatus may be located within a predetermined DOF range.

With recent increases in the size of Liquid Crystal Displays (LCDs), the plate size used in manufacturing an LCD panel is increasing, which, in turn, is causing an increase in the size of a chuck on which the plate is placed during manufacture. However, as the size of the chuck increases, it may be difficult to ensure flatness or balance of the chuck due to, for example, buckling of the chuck by a weight of the chuck or limited mechanical accuracy of the chuck. If the plate placed on the chuck is exposed in a state in which the chuck fails to exhibit flatness or balance, locating the entire plate within a DOF range may be difficult, which increases the likelihood of exposure failure.

Although most exposure apparatuses are provided with an auto-focus module, the auto-focus module has limited abilities, and therefore, the chuck used to support the plate may require an extremely high level of flatness. In addition, since the chuck may be leveled with respect to a focus sensor, it may be necessary to minimize change of the focus throughout the plate.

SUMMARY OF THE INVENTION

Exemplary embodiments of the present invention provide a reduced time for leveling a chuck by previously tuning parameters of the chuck.

Additional features of the invention will be set forth, in part, in the description which follows, and, in part, will be apparent from the description, or may be learned by practice of the invention.

Exemplary embodiments of the present invention disclose a method of tuning parameters of a chuck. The method includes detecting a tilt component of the chuck, adjusting a position of the chuck to remove, at least partially, the tilt component of the chuck, and tuning at least one parameter of the chuck if a residual tilt component is present after adjusting the position of the chuck.

Exemplary embodiments of the present invention also disclose a method of tuning parameters of a chuck. The method includes detecting a tilt component of the chuck, adjusting a position of the chuck to remove, at least partially, a tilt component of the chuck, and if a residual tilt component of the chuck is present after adjusting the position of the chuck, adjusting the position of the chuck, and tuning a scaling parameter and a coordinate parameter of the chuck.

Exemplary embodiments of the present invention also disclose an exposure apparatus including an optical head unit, a chuck, and a controller. The optical head unit irradiates light on an object. The chuck supports the object. The controller detects a tilt component of the chuck, adjusts a position of the chuck to remove, at least partially, the tilt component of the chuck, and tunes at least one parameter of the chuck if a residual tilt component is present after adjusting the position of the chuck.

Exemplary embodiments of the present invention also disclose an exposure apparatus including an optical head unit, a chuck, and a controller. The optical head unit irradiates light on an object. The chuck supports the object. The controller detects a tilt component of the chuck, adjusts a position of the chuck to remove, at least partially, the tilt component of the chuck. If a residual tilt component of the chuck is present after adjusting the position of the chuck, the controller adjusts the position of the chuck, and tunes a scaling parameter and a coordinate parameter of the chuck.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
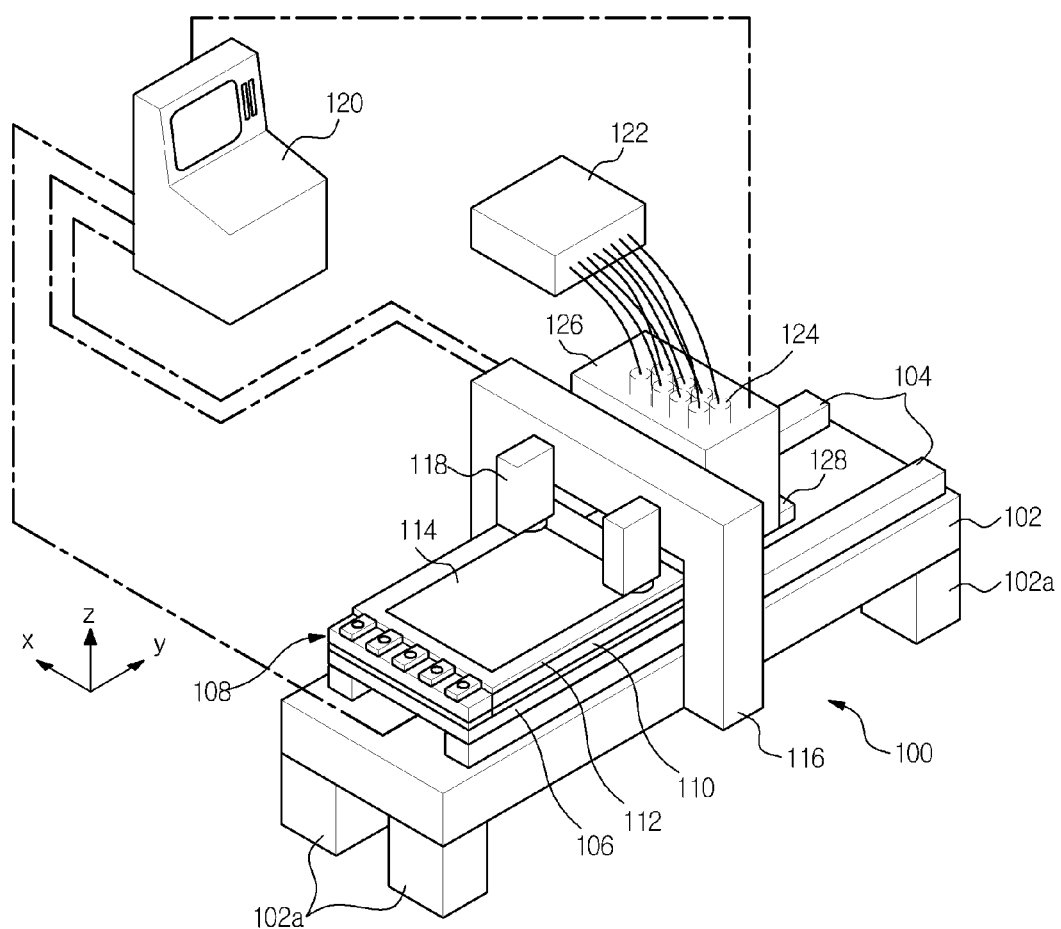
FIG. 1 is a view illustrating an exposure apparatus according to exemplary embodiments of the invention.

Exemplary embodiments of the invention are described more fully hereinafter with reference to the accompanying drawings. The invention may, however, be embodied in many different forms and should not be construed as limited to the exemplary embodiments set forth herein. Rather, the exemplary embodiments are provided so that this disclosure is thorough and complete, and will convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a view illustrating an exposure apparatus according to exemplary embodiments of the present invention. As illustrated in FIG. 1, the exposure apparatus 100 may be a maskless exposure apparatus which does not need a separate mask and a stage for the mask. The exposure apparatus 100 may be a flat bed-type apparatus, and may include a table 102 supported by four legs 102a and a stage 106 movable in X and Y directions on guides 104 placed on the table 102. A plurality of beam detectors 108 may be affixed to one end of the stage 106. A chuck 110 and a plate 112 may be placed on the stage 106. A photoresist (PR) material 114, such as a PR layer, may be applied to an upper surface of the plate 112. A frame 116, in the form of a gate, may be coupled to a central portion of the table 102 and two position sensors 118 may be arranged on one side (e.g., left side) of the frame 116. The position sensors 118 are used to sense movement of the stage 106 and may transmit sensed signals to a controller 120. The beam detectors 108 and the plate 112 may move in X and −X directions and in Y and −Y directions in sync with movement of the stage 106 in X and −X directions and in Y and −Y directions, respectively.

A light source unit 122 and an exposure head unit 126 containing a plurality of exposure heads 124 may be arranged on another side (e.g., right side) of the gate-shaped frame 116. The light source unit 122 is configured to generate light beams, such as laser beams, and, in general, may output radiation in any suitable frequency range. The exposure head unit 126 may receive beams generated from the light source unit 122 and may irradiate multiple beams onto the photoresist material 114 on the plate 112 via the exposure heads 124, thereby allowing a target pattern to be formed on the plate 112.

The controller 120 may control irradiation of multiple beams through a spatial optical modulator (not shown) based on exposure data of the target pattern and implementation of position detection and calibration by the beam detectors 108 and the exposure heads 124.

In FIG. 1, to detect tilting of the chuck 110, a distance sensor 128 may be installed in the exposure head unit 126. The distance sensor 128 may measure a distance in the Z direction between the exposure head unit 126 and the chuck 110. While position sensors 118 may obtain X-Y position information (X-Y coordinates) upon movement of the stage 106, the position sensor 128 may obtain distance information (e.g., Z-directional distance) between the exposure head unit 126 and the plate 112.

Figure 2:
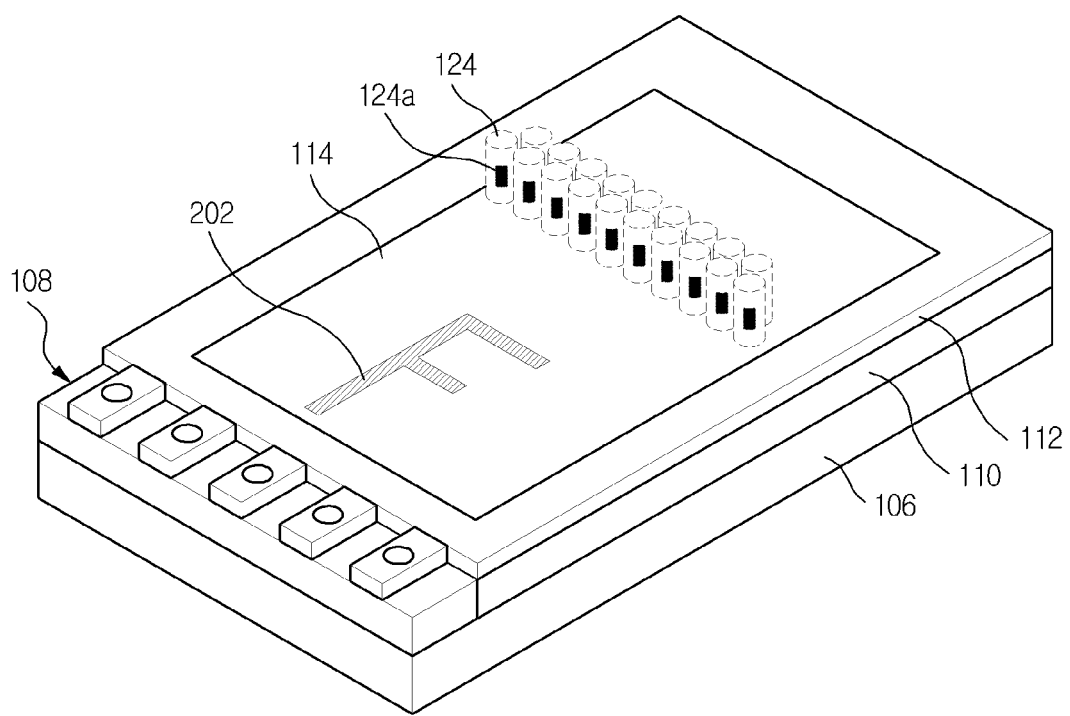
FIG. 2 is a view illustrating a stage and a plurality of exposure heads of the exposure apparatus illustrated in FIG. 1 according to exemplary embodiments of the invention.

FIG. 2 is a view illustrating the stage 106 and the plurality of exposure heads 124 of the exposure apparatus 100 illustrated in FIG. 1. In FIG. 2, as the stage 106 moves in the −Y direction, the plurality of exposure heads 124 may irradiate multiple beams onto the photoresist material 114, allowing a target pattern to be formed on a surface of plate 112. An example of the target pattern includes an "F"-shaped pattern 202, as shown in FIG. 2. It should be understood that any suitable target pattern may be formed.

Each of the exposure heads 124 of the exposure head unit 126 may include a focus sensor 124a. The focus sensor 124a may assist in focusing light on the plate 112 for accurate exposure. The focus sensor 124a may also detect tilting of the chuck 110. For example, to determine whether the chuck 110 is tilted, the exposure head 124, with the assistance of focus sensor 124a, may focus light at a particular position (e.g., primary position) of the chuck 110 and at another position (e.g., secondary position) of the chuck 110. If the exposure head 124 succeeds in focusing light at the two positions (e.g., primary and secondary positions), as detected by focus sensor 124a, this means that the two positions of the chuck 110 are at the same distance from the exposure head 124 and that no tilt component is present. If the exposure head 124 fails to consistently focus light at the two positions (e.g., primary and secondary positions), this means the two positions are not at the same distance from the exposure head 124 and that a tilt component is present.

Both the focus sensor 124a and the Z-directional distance sensor 128 may measure Z-directional distances. Measuring the Z-directional distance of the chuck 110 using the focus sensor 124a provided at the exposure head 124 will be described by way of example.

Figure 3:
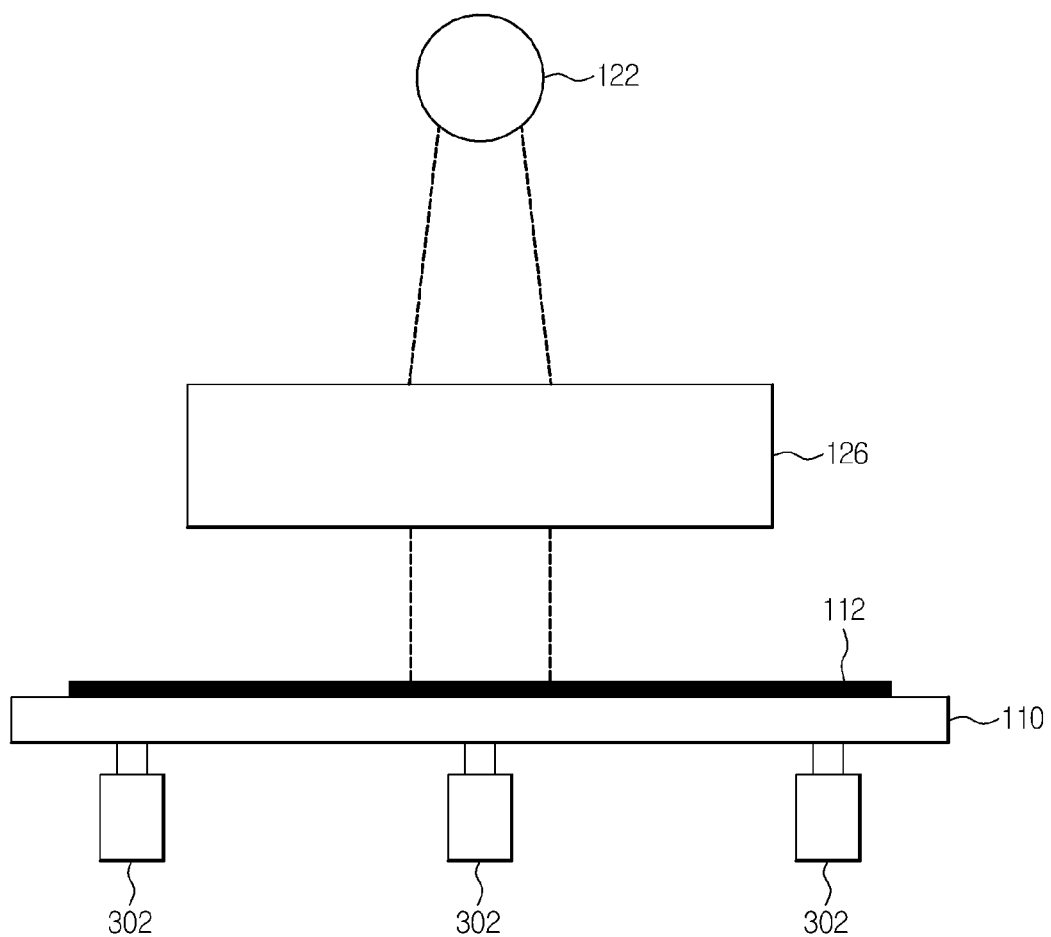
FIG. 3 is a view illustrating the exposure apparatus of FIG. 1 according to exemplary embodiments of the invention.

FIG. 3 is a view illustrating the exposure apparatus 100 of FIG. 1. As illustrated in FIG. 3, beams generated from the light source unit 122 are irradiated onto the plate 112 on the chuck 110 via the exposure head unit 126. The chuck 110 may be a multi-point support chuck and may be driven by three chuck actuators 302. The three chuck actuators 302 may be operable collectively or individually to move the chuck 110 in a vertical direction (Z direction) to enable leveling of the chuck 110.

Figure 4A:
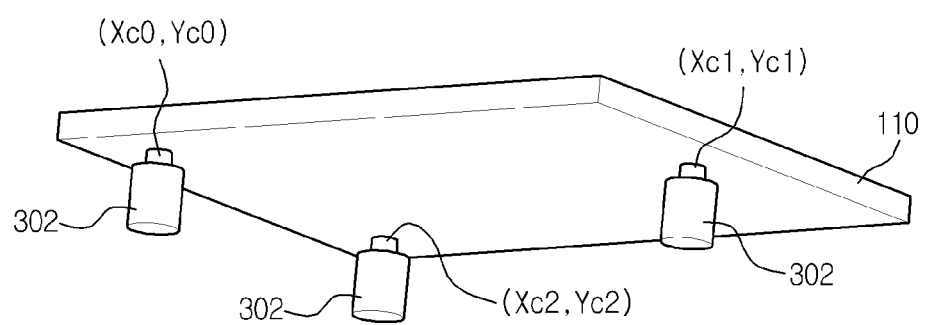
FIG. 4A and FIG. 4B are views illustrating a multi-point support configuration of a chuck illustrated in FIG. 3 according to exemplary embodiments of the invention.
Figure 4B:
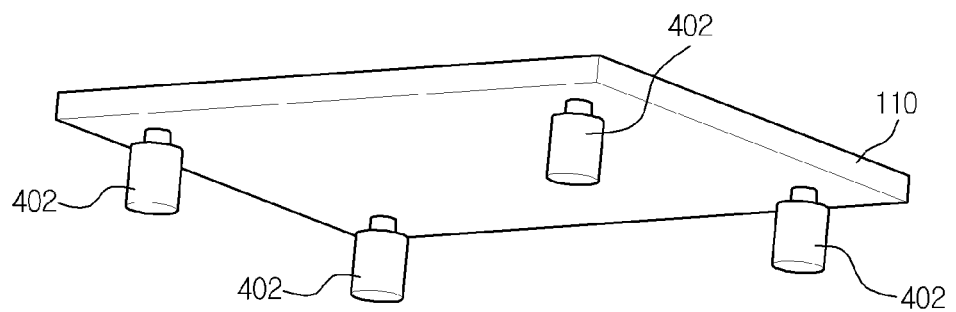

FIG. 4A and FIG. 4B are views illustrating the multi-point support configuration of the chuck 110 illustrated in FIG. 3. In FIG. 4, the chuck 110 is viewed from the bottom, i.e., from the opposite side of the surface on which the plate 112 is placed. The chuck 110 may be driven in a full constraint mode by the three chuck actuators 302, as illustrated in FIG. 4A, or may be driven in an over constraint mode by four (or more) actuators 402, as illustrated in FIG. 4B. The three chuck actuators 302 may be tuned to control the positioning of the chuck 110. For example, the XY coordinates of the chuck actuators 302 may be (Xc0, Yc0), (Xc1, Yc1), and (Xc2, Yc2) as shown in FIG. 4A. Controller 120 may send a control signal to chuck actuator 302 located at one of the three positions, for example (Xc0, Yc0), to increase or decrease a height of the chuck 110 around coordinates (Xc0, Yc0).

Figure 5A:
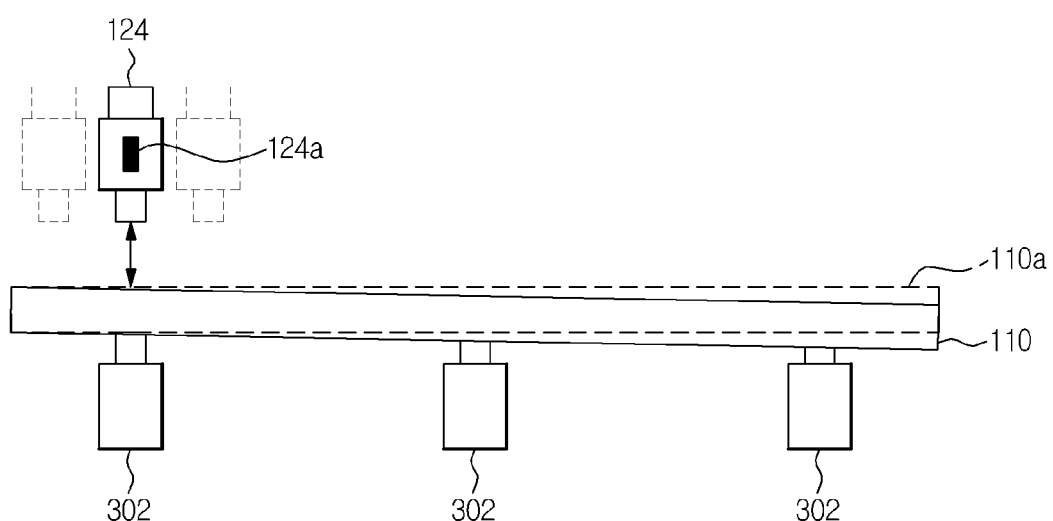
FIG. 5A, FIG. 5B and FIG. 5C are views illustrating a method of detecting a tilt component of a 3-point support chuck according to exemplary embodiments of the invention.
Figure 5B:
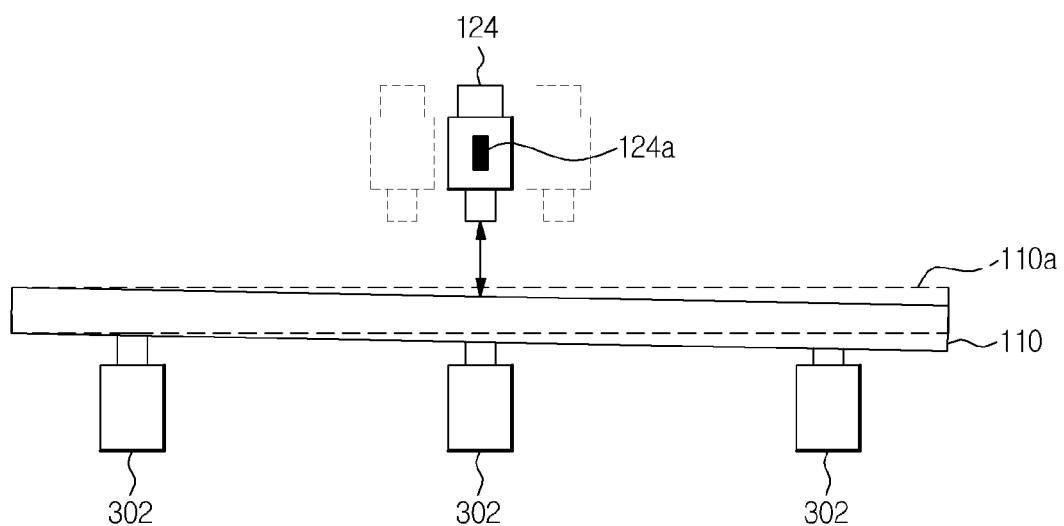
Figure 5C:
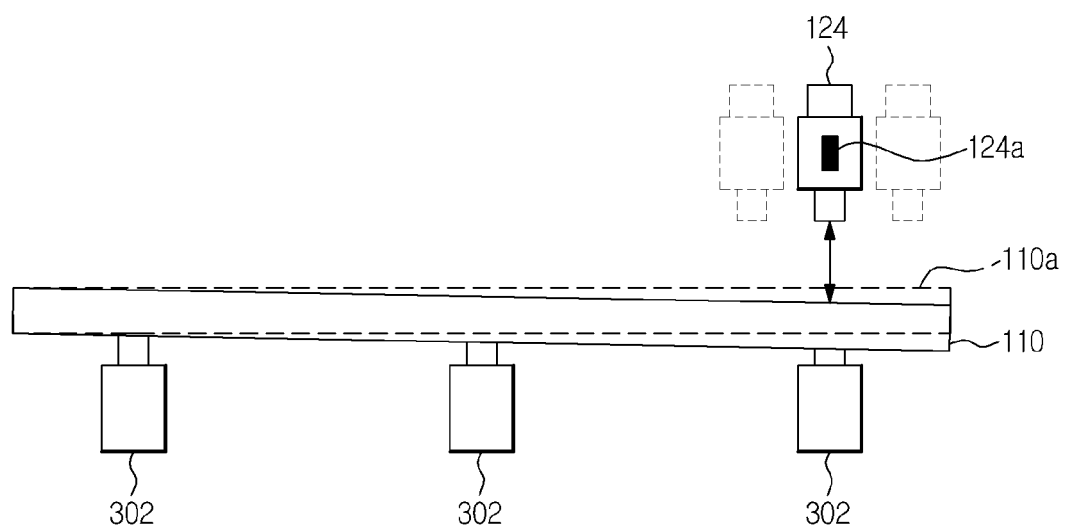

FIG. 5A, FIG. 5B, and FIG. 5C are views illustrating a method of detecting a tilt component of the 3-point support chuck 110. In FIG. 5A, FIG. 5B, and FIG. 5C, a chuck 110a, illustrated by a dotted line, represents an ideal case in which accurate leveling of chuck 110 is realized (i.e., no tilt component), and a chuck 110b, illustrated by a solid line, represents a case in which a tilt component is present. Measurement of a Z directional distance between the exposure head unit 126 and the chuck 110 may be performed at respective positions of the chuck actuators 302 that are used to control the Z directional movement of the chuck 110. For example, as illustrated in FIG. 5A, the Z directional distance between the exposure head unit 126 and the chuck 110 may be measured at any one position of the three actuators 302 via any one of the focus sensors 124a of the plurality of exposure heads 124 of the exposure head unit 126. As illustrated in FIG. 5B, the Z directional distance between the exposure head 126 and the chuck 110 may be measured at another position of the three actuators 302 via the focus sensor 124a of the same exposure head 124 used in FIG. 5A. Also, as illustrated in FIG. 5C, the Z directional distance between the exposure head unit 126 and the chuck 110 may be measured at a third position of the three actuators 302 via the focus sensor 124a of the same exposure head 124 as used in FIG. 5A and FIG. 5B. The measured Z directional distances obtained at the various positions on the chuck 100 may be provided to controller 120 for further processing. The presence or absence of the tilt component may be determined by controller 120 based on the measured results of the Z directional distance at the respective positions of the three chuck actuators 302. If the distance between the exposure head unit 126 and the chuck 110 is not the same at a plurality of positions of the chuck 110 and is shorter or greater at a particular position, it is recognized that the chuck 110 is tilted relative to the exposure head unit 126 and thus, a tilt component is present.

Figure 6:
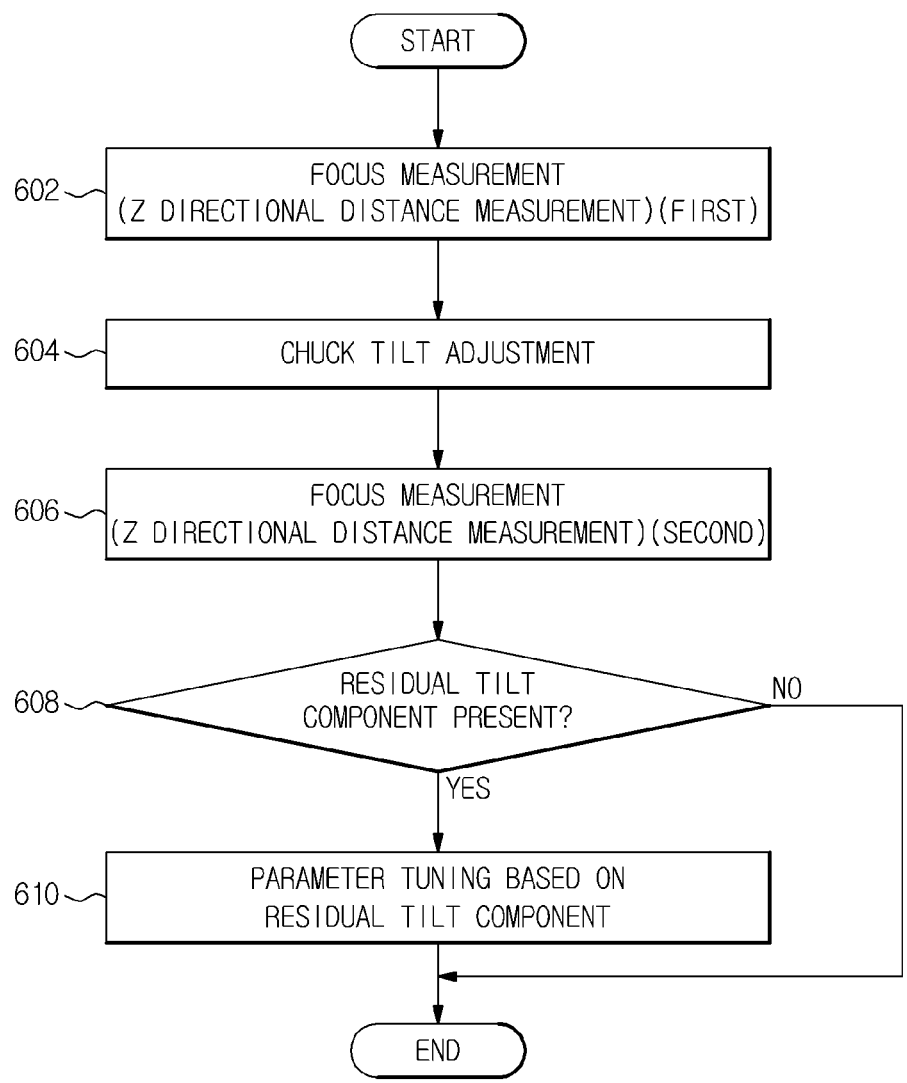
FIG. 6 is a flowchart illustrating a method of tuning parameters of a 3-point support chuck according to exemplary embodiments of the invention.

FIG. 6 is a flowchart illustrating a method of tuning parameters of the 3-point support chuck 110 according to exemplary embodiments of the present invention. As illustrated in FIG. 6, to tune parameters of the exposure apparatus 100, a focus of light (or Z directional distance) between the exposure head unit 126 and the chuck 110 may be measured as described with reference to FIG. 5 (602). The tilt of the chuck 110 may be adjusted, if needed, based on the measured focus (or Z directional distance) result (604). In some cases, to adjust the tilt of the chuck 110, a portion of the chuck 110 having a Z directional height larger than a determined amount relative to the exposure head unit 126 may be moved toward the exposure head unit 126 so as to reduce a distance from the exposure head unit 126. In some cases, a portion of the chuck 110 having a Z directional height smaller than a determined amount relative to the exposure head unit 126 may be moved away from the exposure head unit 126 so as to increase a distance from the exposure head unit 126. This tilt adjustment may correct tilting of the chuck 110, thus causing surfaces of the exposure head unit 126 and the chuck 110 to be parallel to each other. After completion of the tilt adjustment of the chuck 110, the Z directional distance is again measured to judge whether or not the tilt component of the chuck 110 is still present (606). If the tilt component does not remain (No in operation 608), parameter tuning is not necessary and is ended. On the contrary, if the tilt component of the chuck 110 remains (Yes in operation 608), parameter tuning based on the residual tilt component is performed (610).

Judgment of the residual tilt component is further explained in detail as follows. Parameter tuning may require a preliminary process consisting of <(First) Focus Measurement>, <Chuck Tilt Adjustment>, and <(Second) Focus Measurement>. For example, after the <(First) Focus Measurement>, <Chuck Tilt Adjustment> may be performed based on <(First) Focus Measurement>, and then <(Second) Focus Measurement> may be performed to confirm how much tilt component remains after the <Chuck Tilt Adjustment>. As such, subsequent parameter tuning may be performed based on the residual tilt component.

Equation 1 is given by obtaining a focus value Zk from <(First) Focus Measurement> with respect to "n" measuring points Ps on the upper surface of the chuck 110. The focus value Zk may be obtained using focus sensor 124a.

$$\overset{Ps}{\begin{bmatrix} x_{s0} & y_{s0} & 1 \\ x_{s1} & y_{s1} & 1 \\ \vdots & \vdots & \vdots \\ x_{sn} & y_{sn} & 1 \end{bmatrix}} \overset{Ceof}{\begin{bmatrix} a \\ b \\ c \end{bmatrix}} = \overset{Zk}{\begin{bmatrix} z_{k0} \\ z_{k1} \\ \vdots \\ z_{kn} \end{bmatrix}} \quad \text{Equation 1}$$

A plane coefficient vector Coef of an optimum plane, obtained using a least squares method from Equation 1 and a plane equation ax+by+c=z, may be represented by Coef=pinv (Ps)*Zk. 'pinv' is a pseudo inverse matrix and the symbol '*' represents multiplication.

By multiplying the vector Coef by a coordinate value matrix Pc of a drive shaft of the chuck 110, a drive amount Za of the chuck 110 at each position of the chuck 110 may be calculated by the following Equation 2. <Chuck Tilt Adjustment> is performed by driving the chuck 110 based on the calculated drive amount Za.

$$\overset{Pc}{\begin{bmatrix} x_{c0} & y_{c0} & 1 \\ x_{c1} & y_{c1} & 1 \\ x_{c2} & y_{c2} & 1 \end{bmatrix}} \overset{Ceof}{\begin{bmatrix} a \\ b \\ c \end{bmatrix}} = \overset{Za}{\begin{bmatrix} z_{a0} \\ z_{a1} \\ z_{a2} \end{bmatrix}} \quad \text{Equation 2}$$

After <Chuck Tilt Adjustment>, <(Second) Focus Measurement> may be performed with respect to "n" measuring points on the upper surface of the chuck 110 to obtain a plane coefficient vector, and a drive amount at each support point may be calculated.

In some cases, if parameter tuning is not performed, one <(First) Focus Measurement> and one <Chuck Tilt Adjustment> may be insufficient to remove the tilt component of the chuck 110 and therefore, a drive amount vector of the chuck 110 does not become a zero matrix. Accordingly, a residual tilt component may be present. By performing parameter tuning based on the detected residual tilt component via <(Second) Focus Measurement>, the drive amount vector Za' of the chuck 110 may have a value near zero after parameter tuning.

In the following Equation 3, a focus value Zk is obtained by performing a <(Second) Focus Measurement> with respect to "n" measuring points Ps on the upper surface of the chuck 110.

$$\overset{Ps}{\begin{bmatrix} x_{s0} & y_{s0} & 1 \\ x_{s1} & y_{s1} & 1 \\ \vdots & \vdots & \vdots \\ x_{sn} & y_{sn} & 1 \end{bmatrix}} \overset{Ceof}{\begin{bmatrix} a \\ b \\ c \end{bmatrix}} = \overset{Zk}{\begin{bmatrix} z_{k0} \\ z_{k1} \\ \vdots \\ z_{kn} \end{bmatrix}} \quad \text{Equation 3}$$

The drive amount Za of the chuck 110 may be calculated using Equation 4. In Equation 4, parameters to be tuned include a scaling parameter Za between the focus sensor 124a of the exposure head 124 and the chuck drive amount, and a coordinate parameter Pc of the chuck actuator 302. The scaling parameter Za may include a cosine error caused by inconsistencies between a sensing axis of the focus sensor 124a and a drive axis of the chuck actuator 302.

$$\overset{Pc}{\begin{bmatrix} x_{c0} & y_{c0} & 1 \\ x_{c1} & y_{c1} & 1 \\ \vdots & \vdots & \vdots \\ x_{c2} & y_{c2} & 1 \end{bmatrix}} \overset{Ceof}{\begin{bmatrix} a \\ b \\ c \end{bmatrix}} = \overset{Za}{\begin{bmatrix} z_{a0} \\ z_{a1} \\ \vdots \\ z_{a2} \end{bmatrix}} \quad \text{Equation 4}$$

Since a nominal value with respect to an assembly point between the chuck actuators 302 and the chuck 110 may be present, an assembly error or processing error may also be present. Therefore, accurate control may be realized when such error is corrected. Parameter tuning may correct this error.

Figure 7:
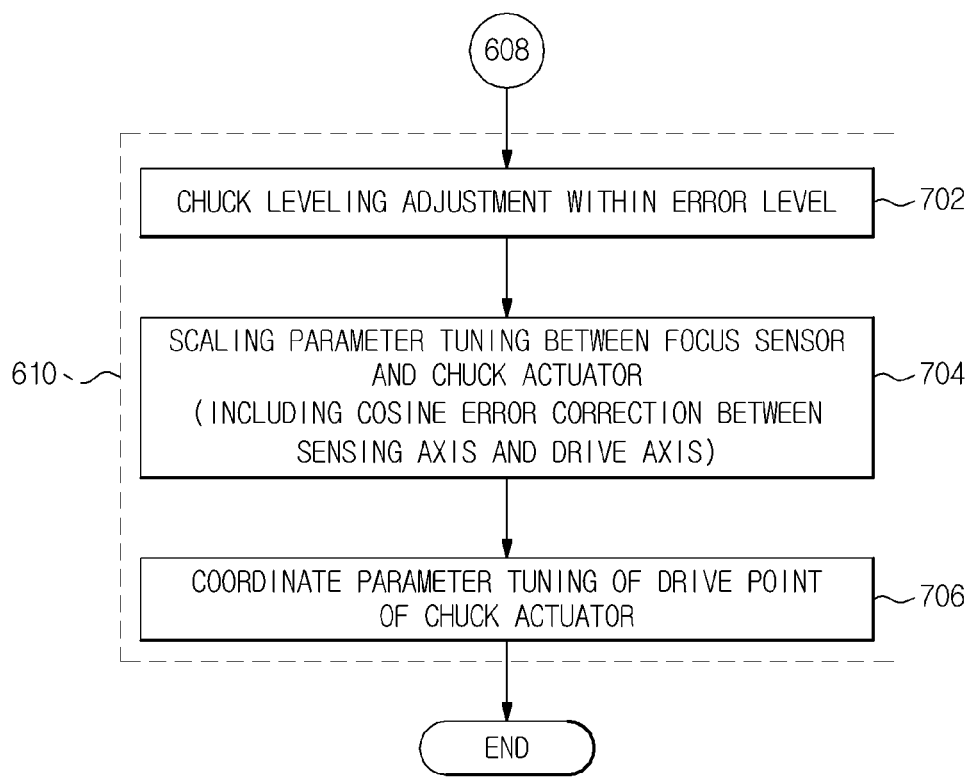
FIG. 7 is a flowchart illustrating a method of tuning parameters based on a residual tilt component in relation to the parameter tuning method of FIG. 6, according to exemplary embodiments of the invention.

FIG. 7 is a flowchart illustrating a parameter tuning method based on the residual tilt component in relation to the parameter tuning method of FIG. 6. As illustrated in FIG. 7, first, <Chuck Leveling Adjustment> may be performed to adjust leveling of the chuck 110 within an error range (702). Thereafter, <Scaling Parameter Tuning> may be performed to tune the scaling parameter between the focus sensor 124a and the chuck actuator 302 (704). <Scaling Parameter Tuning> includes correction of a possible cosine error between the sensing axis of the focus sensor 124a and the drive axis of the chuck actuator 302. Additionally, <Coordinate Parameter Tuning> is performed to tune XY coordinates of a drive position of the chuck actuator 302 (706).

In the method of FIG. 7, <Coordinate Parameter Tuning> may be inaccurate if <Scaling Parameter Tuning> has been not performed, whereas <Scaling Parameter Tuning> may be inaccurate if <Coordinate Parameter Tuning> has been not performed. However, because the likelihood of <Coordinate Parameter Tuning> being inaccurate in a state in which <Scaling Parameter Tuning> has been not performed is greater, <Scaling Parameter Tuning> may be performed prior to performing <Coordinate Parameter Tuning>.

To allow <Coordinate Parameter Tuning> to be less affected by <Scaling Parameter Tuning>, leveling the chuck 110 within an error level may be necessary even by repeatedly performing <Chuck Tilt Adjustment>. 'Error level' means an error within an allowable error range in consideration of tolerances of the focus sensor 124a, the chuck 110, and the chuck actuator 302.

<Scaling Parameter Tuning> and <Coordinate Parameter Tuning> illustrated in FIG. 7 will be described below in more detail.

<Scaling Parameter Tuning>

The chuck 110 may be level before <Scaling Parameter Tuning> and therefore, the drive amount Za of the chuck actuator 302 calculated from a plurality of measured focus values may be zero, as noted in Equation 5.

$$\begin{bmatrix} x_{c0} & y_{c0} & 1 \\ x_{c1} & y_{c1} & 1 \\ x_{c2} & y_{c2} & 1 \end{bmatrix}^{Pc} \begin{bmatrix} a \\ b \\ c \end{bmatrix}^{Ceof} = \begin{bmatrix} z_{a0} \\ z_{a1} \\ z_{a2} \end{bmatrix}^{Za} \cong 0 \qquad \text{Equation 5}$$

When the chuck 110 is completely level, the chuck 110 may be subjected to parallel movement by a certain distance Zadd. Parallel movement means that the chuck 110, which may be maximally parallel to the exposure head unit 126, may be linearly moved toward or away from the exposure head unit 126. When performing <Scaling Parameter Tuning> based on the movement distance Zadd of the chuck 110, scaling of the focus sensor 124 may be equal to scaling of the chuck drive shaft 302.

$$\begin{bmatrix} x_{c0} & y_{c0} & 1 \\ x_{c1} & y_{c1} & 1 \\ x_{c2} & y_{c2} & 1 \end{bmatrix}^{Pc} \begin{bmatrix} a' \\ b' \\ c' \end{bmatrix}^{Ceof'} = \begin{bmatrix} z'_{a0} \\ z'_{a1} \\ z'_{a2} \end{bmatrix}^{Za'} = \begin{bmatrix} \alpha_0^* & z_{a0} \\ \alpha_1^* & z_{a1} \\ \alpha_2^* & z_{a2} \end{bmatrix}^{\alpha} \qquad \text{Equation 6}$$

Because a≈0 and b≈0 are obtained owing to completion of the leveling adjustment 702 of the chuck 110 and a≈0 and b≈0 are obtained owing to parallel movement of the chuck 110 by the distance Zadd, the effect of inaccuracy of the matrix Pc to be tuned in <Coordinate Parameter Tuning> may be minimized.

In the above Equation 6, a scaling vector a is represented by α=Zadd./(Za'−Za). "./" may refer to an operation between elements of a matrix. Because Equation 6 may be expressed in various dimensions, Equation 6 may be applied to a multi-point (e.g., four or more point) support chuck as well as a 3-point support chuck.

<Coordinate Parameter Tuning>

$$\begin{bmatrix} x_{c0} & y_{c0} & 1 \\ x_{c1} & y_{c1} & 1 \\ x_{c2} & y_{c2} & 1 \end{bmatrix}^{Pc} \begin{bmatrix} a \\ b \\ c \end{bmatrix}^{Ceof} = \begin{bmatrix} z_{a0} \\ z_{a1} \\ z_{a2} \end{bmatrix}^{Za} \qquad \text{Equation 7}$$

$$\begin{bmatrix} x_{c0} & y_{c0} & 1 \\ x_{c1} & y_{c1} & 1 \\ x_{c2} & y_{c2} & 1 \end{bmatrix}^{Pc} \begin{bmatrix} a' \\ b' \\ c' \end{bmatrix}^{Ceof'} = \begin{bmatrix} z'_{a0} \\ z'_{a1} \\ z'_{a2} \end{bmatrix}^{Za'} \qquad \text{Equation 8}$$

Equations for <Coordinate Parameter Tuning> include Equations 7 and 8.

In Equation 8, Δ may be a difference between an actual value and a nominal value of the position of the actuator 302 of the chuck 110. <Coordinate Parameter Tuning> of the chuck 110 may be performed based on the result of the error matrix, represented by Equation 9.

$$\begin{bmatrix} \Delta x_{c0} & \Delta y_{c0} \\ \Delta x_{c1} & \Delta y_{c1} \\ \Delta x_{c2} & \Delta y_{c2} \end{bmatrix} \begin{bmatrix} z'_{a0} & z'^{\sim}_{a0} & \dots \\ z'_{a1} & z'^{\sim}_{a1} & \dots \\ z'_{a2} & z'^{\sim}_{a2} & \dots \end{bmatrix} * pinv\left( \begin{bmatrix} a & a^{\sim} & \dots \\ b & b^{\sim} & \dots \end{bmatrix} \right) \qquad \text{Equation 9}$$

In Equation 9, Za0', Za1' and Za2' are secondly measured focus values within the same measurement set (e.g., a first measurement set), and 'Za0', 'Za1' and 'Za2' are measured focus values within another measurement set (e.g., a second measurement set). As can be appreciated from Equation 9, <Coordinate Parameter Tuning> may require at least two focus measurement sets. The number of focus measurement sets for performing parameter tuning may be determined based on a number of focus measurement sets which exhibit convergence of parameter tuning values.

Equation 10 represents an expanded equation with respect to a multi-point support chuck (having four or more support points).

$$\begin{bmatrix} \Delta x_{c0} & \Delta y_{c0} \\ \Delta x_{c1} & \Delta y_{c1} \\ \Delta x_{c2} & \Delta y_{c2} \\ \vdots & \vdots \end{bmatrix} = \begin{bmatrix} z'_{a0} & z'^{\sim}_{a0} & \dots \\ z'_{a1} & z'^{\sim}_{a1} & \dots \\ z'_{a2} & z'^{\sim}_{a2} & \dots \\ \vdots & \vdots & \vdots \end{bmatrix} * pinv\left( \begin{bmatrix} a & a^{\sim} & \dots \\ b & b^{\sim} & \dots \end{bmatrix} \right) \qquad \text{Equation 10}$$

Derivation and demonstration of the equations above are as follows.

First, Equations with respect to two sets are derived as follows.

$$\Delta Pc_{\_} = \begin{bmatrix} \Delta x_{c0} & \Delta y_{c0} & 0 \\ \Delta x_{c1} & \Delta y_{c1} & 0 \\ \Delta x_{c2} & \Delta y_{c2} & 0 \end{bmatrix} \qquad \text{Equation 11}$$

$$Pc_{\_} = \begin{bmatrix} x_{c0\_} & y_{c0\_} & 1 \\ x_{c1\_} & y_{c1\_} & 1 \\ x_{c2\_} & y_{c2\_} & 1 \end{bmatrix} \qquad \text{Equation 12}$$

When Za' equals zero, Pc_+ΔPc_=Pc, where ΔPc_ and Pc_ are defined in Equations 11 and 12. (Pc_+ΔPc_)*Coef=Za_+ ΔZa_ is established from Pc*Coef=Za_.

As represented by Equation 13, Pc_*Coef=Za' is established using Pc_*Coef=Za_.

$$\begin{bmatrix} \Delta x_{c0} & \Delta y_{c0} & 0 \\ \Delta x_{c1} & \Delta y_{c1} & 0 \\ \Delta x_{c2} & \Delta y_{c2} & 0 \end{bmatrix} \begin{bmatrix} a \\ b \\ c \end{bmatrix} = \begin{bmatrix} z'_{a0} \\ z'_{a1} \\ z'_{a2} \end{bmatrix} \qquad \text{Equation 13}$$

Equation 13 may be simplified and expressed as Equation 14.

$$\begin{bmatrix} \Delta x_{c0} & \Delta y_{c0} \\ \Delta x_{c1} & \Delta y_{c1} \\ \Delta x_{c2} & \Delta y_{c2} \end{bmatrix} \begin{bmatrix} a \\ b \end{bmatrix} = \begin{bmatrix} z'_{a0} \\ z'_{a1} \\ z'_{a2} \end{bmatrix} \qquad \text{Equation 14}$$

In Equation 14, there exists only 3 degrees of freedom due to a subordinate relationship between Coef and Za'. Because there are six unknown quantities, the degree of freedom may be increased via two or more focus measurements (Coef) as represented by the Equations 15 and 16.

$$\begin{bmatrix} \Delta X_{c0} & \Delta Y_{c0} \\ \Delta X_{c1} & \Delta Y_{c1} \\ \Delta X_{c2} & \Delta Y_{c2} \end{bmatrix} \begin{bmatrix} a & a^{\sim} & \dots \\ b & b^{\sim} & \dots \end{bmatrix} = \begin{bmatrix} Z'_{a0} & Z'^{\sim}_{a0} & \dots \\ Z'_{a1} & Z'^{\sim}_{a1} & \dots \\ Z'_{a2} & Z'^{\sim}_{a2} & \dots \end{bmatrix} \quad \text{Equation 15}$$

$$\begin{bmatrix} \Delta X_{c0} & \Delta Y_{c0} \\ \Delta X_{c1} & \Delta Y_{c1} \\ \Delta X_{c2} & \Delta Y_{c2} \end{bmatrix} = \begin{bmatrix} Z'_{a0} & Z'^{\sim}_{a0} & \dots \\ Z'_{a1} & Z'^{\sim}_{a1} & \dots \\ Z'_{a2} & Z'^{\sim}_{a2} & \dots \end{bmatrix} * pinv\left( \begin{bmatrix} a & a^{\sim} & \dots \\ b & b^{\sim} & \dots \end{bmatrix} \right) \quad \text{Equation 16}$$

Equations 17 and 18 prove that Equation 16 may be true regardless of the number of focus measurements. If n≥m with respect to a 'm×n' matrix A, $pinv(A)=A^T(AA^T)^{-1}$, and thus, $A*pinv(A)=AA^T(AA^T)^{-1}$ is utilized.

$$\begin{bmatrix} Z'_{a0} & Z'^{\sim}_{a0} & \dots \\ Z'_{a1} & Z'^{\sim}_{a1} & \dots \\ Z'_{a2} & Z'^{\sim}_{a2} & \dots \end{bmatrix} = [Za' \quad Za'^{\sim} \quad \dots ] \quad \text{Equation 17}$$

$$= [\Delta Pc\_ * Coef \quad \Delta Pc\_ * Coef^{\sim} \quad \dots]$$

$$= \Delta Pc\_ * [Coef \quad Coef^{\sim} \quad \dots]$$

$$= \begin{bmatrix} \Delta X_{c0} & \Delta Y_{c0} \\ \Delta X_{c1} & \Delta Y_{c1} \\ \Delta X_{c2} & \Delta Y_{c2} \end{bmatrix} * \begin{bmatrix} a & a^{\sim} & \dots \\ b & b^{\sim} & \dots \end{bmatrix} \quad (\because$$

$$\Delta Pc\_ = \begin{bmatrix} \Delta X_{c0} & \Delta Y_{c0} & 0 \\ \Delta X_{c1} & \Delta Y_{c1} & 0 \\ \Delta X_{c2} & \Delta Y_{c2} & 0 \end{bmatrix})$$

Equation 18 is established by summing the right side of Equation 16 and thus, it will be understood that Equation 18 has the same value as the left side of Equation 16.

$$\text{right side of Eq. 16} = \begin{bmatrix} Z'_{a0} & Z'^{\sim}_{a0} & \dots \\ Z'_{a1} & Z'^{\sim}_{a1} & \dots \\ Z'_{a2} & Z'^{\sim}_{a2} & \dots \end{bmatrix} * pinv\left( \begin{bmatrix} a & a^{\sim} & \dots \\ b & b^{\sim} & \dots \end{bmatrix} \right) \quad \text{Equation 18}$$

$$= \begin{bmatrix} \Delta X_{c0} & \Delta Y_{c0} \\ \Delta X_{c1} & \Delta Y_{c1} \\ \Delta X_{c2} & \Delta Y_{c2} \end{bmatrix} * \begin{bmatrix} a & a^{\sim} & \dots \\ b & b^{\sim} & \dots \end{bmatrix} * pinv\left( \begin{bmatrix} a & a^{\sim} & \dots \\ b & b^{\sim} & \dots \end{bmatrix} \right)$$

$$= \begin{bmatrix} \Delta X_{c0} & \Delta Y_{c0} \\ \Delta X_{c1} & \Delta Y_{c1} \\ \Delta X_{c2} & \Delta Y_{c2} \end{bmatrix}$$

$$= \text{left side of Eq. 16}$$

As is apparent from the above description, by previously tuning parameters of a chuck 110, a time taken to level the chuck 110 may be reduced, which may increase process yield and result in improved productivity.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of tuning parameters of a chuck, comprising:
   detecting a tilt component of the chuck;
   adjusting a position of the chuck to remove, at least, partially, the tilt component of the chuck; and
   tuning at least one parameter of the chuck if a residual tilt component of the chuck is present after adjusting the position of the chuck,
   wherein the at least one parameter comprises a parameter using coordinates of actuators of the chuck, the actuators of the chuck being actuators for moving the chuck in a direction perpendicular to a top surface of the chuck.

2. The method of claim 1, wherein the at least one parameter of the chuck comprises:
   a scaling parameter; and
   a coordinate parameter.

3. The method of claim 1, wherein tuning the at least one parameter of the chuck comprises:
   tuning a scaling parameter of the chuck; and
   tuning a coordinate parameter of the chuck.

4. The method of claim 3, wherein tuning the scaling parameter comprises moving the chuck a distance in a direction perpendicular to a top surface of the chuck and tuning the scaling parameter based on the moved distance.

5. The method of claim 4, wherein tuning the scaling parameter further comprises correcting a cosine error between a sensing axis of a distance sensor and a drive axis of the chuck.

6. The method of claim 3, wherein tuning the coordinate parameter comprises reconciling coordinates of a distance sensor and the chuck with each other based on an error matrix representing a difference between a nominal value and an actual value of a position of an actuator of the chuck.

7. A method of tuning parameters of a chuck, comprising:
   detecting a tilt component of the chuck;
   adjusting a position of the chuck to remove, at least partially, the tilt component of the chuck; and
   if a residual tilt component of the chuck is present after adjusting the position of the chuck, adjusting the position of the chuck, and tuning a scaling parameter and a coordinate parameter of the chuck.

8. The method of claim 7, wherein tuning the scaling parameter comprises moving the chuck a distance in a direction perpendicular to a top surface of the chuck and tuning the scaling parameter based on the moved distance.

9. The method of claim 8, wherein tuning the scaling parameter further comprises correcting a cosine error between a sensing axis of a distance sensor and a drive axis of the chuck.

10. The method of claim 8, wherein tuning the coordinate parameter comprises reconciling coordinates of a distance sensor and the chuck with each other based on an error matrix representing a difference between a nominal value and an actual value of a position of an actuator of the chuck.

11. The method of claim 3, wherein tuning the coordinate parameter comprises:
    obtaining an error matrix representing a difference between a nominal value and an actual value of a position of an actuator of the chuck, the position of the actuator corresponding to a coordinate value of the chuck; and
    tuning the coordinate of the chuck based on the error matrix.

12. The method of claim 11, wherein tuning the coordinate parameter comprises:
    measuring a first drive amount of the actuator;
    obtaining a first plane coefficient vector based on the measured first drive amount and the nominal value of the position of the actuator;
    measuring a second drive amount of the actuator;

obtaining a second plane coefficient vector based on the measured second drive amount and the nominal value of the position of the actuator; and obtaining the error matrix based on the first drive amount, the second drive amount, the first plane coefficient vector, and the second plane coefficient vector.

13. A method of tuning parameters of a chuck, comprising:
detecting a tilt component of the chuck;
adjusting a position of the chuck to remove, at least, partially, the tilt component of the chuck; and
tuning at least one parameter of the chuck if a residual tilt component of the chuck is present after adjusting the position of the chuck,
wherein detecting the tilt component of the chuck comprises:
obtaining a first focus value vector Zk associated with first measuring coordinates Ps;
obtaining a first plane coefficient vector based on the first measuring coordinates Ps and the first focus value vector Zk; and
determining a first drive amount vector Za based on the first plane coefficient vector and coordinates of at least three actuators of the chuck.

14. The method of claim 13, wherein adjusting the position of the chuck comprises:
driving one or more of the at least three actuators based on the first drive amount vector Za.

15. The method of claim 14, wherein tuning the at least one parameter of the chuck comprises:
obtaining a second focus value vector associated with second measuring coordinates;
obtaining a second plane coefficient vector based on the second measuring coordinates and the second focus value vector; and
determining a second drive amount vector based on the second plane coefficient vector and coordinates of at least three actuators of the chuck.

16. The method of claim 15, wherein tuning the at least one parameter of the chuck comprises:
determining the residual tilt component of the chuck based on the second drive amount vector; and
tuning a scaling parameter of the chuck and a coordinate parameter of the chuck to remove the residual tilt component.

* * * * *